United States Patent
Shiine et al.

(10) Patent No.: US 10,191,504 B2
(45) Date of Patent: Jan. 29, 2019

(54) LEAKAGE CURRENT COMPENSATION CIRCUIT AND SEMICONDUCTOR DEVICE

(71) Applicant: ABLIC Inc., Chiba-shi, Chiba (JP)

(72) Inventors: Yuji Shiine, Chiba (JP); Hirotaka Nakamura, Hamamatsu (JP)

(73) Assignee: ABLIC INC., Chiba-Shi (JP)

( * ) Notice: Subject to any disclaimer, the term of this patent is extended or adjusted under 35 U.S.C. 154(b) by 0 days.

(21) Appl. No.: 15/879,668

(22) Filed: Jan. 25, 2018

(65) Prior Publication Data

US 2018/0217624 A1    Aug. 2, 2018

(30) Foreign Application Priority Data

Jan. 30, 2017  (JP) ................................ 2017-014127

(51) Int. Cl.
*G05F 1/10*   (2006.01)
*G05F 1/625*  (2006.01)
*H01L 23/58*  (2006.01)

(52) U.S. Cl.
CPC .............. *G05F 1/625* (2013.01); *H01L 23/58* (2013.01)

(58) Field of Classification Search
None
See application file for complete search history.

(56) References Cited

U.S. PATENT DOCUMENTS

| 8,498,085 B2 * | 7/2013 | Altolaguirre | H02H 9/046 361/118 |
| 2006/0097774 A1 * | 5/2006 | Hasegawa | G05F 3/262 327/538 |

FOREIGN PATENT DOCUMENTS

JP    H08-340246 A    12/1996

* cited by examiner

*Primary Examiner* — Long Nguyen
(74) *Attorney, Agent, or Firm* — Brinks Gilson & Lione

(57) ABSTRACT

Provided is a leakage current compensation circuit including: a compensation MOS transistor, which has a drain and a source connected to each other, and a bulk connected to a ground terminal, and is configured to generate a compensation current that is equal in magnitude to a leakage current of a MOS transistor of a current output circuit; and a current mirror circuit, which has an input terminal connected to the drain and the source of the compensation MOS transistor, and an output terminal connected to the MOS transistor of the current output circuit. The leakage current compensation circuit includes the MOS transistor for compensation for the leakage current, which has a small area, and is capable of compensating for a gate leakage current.

6 Claims, 4 Drawing Sheets

LEAKAGE CURRENT COMPENSATION CIRCUIT AND SEMICONDUCTOR DEVICE

RELATED APPLICATIONS

This application claims priority under 35 U.S.C. §119 to Japanese Patent Application No. 2017-014127 filed on Jan. 30, 2017, the entire content of which is hereby incorporated by reference.

BACKGROUND OF THE INVENTION

1. Field of the Invention

The present invention relates to a leakage current compensation circuit configured to compensate for a leakage current of a MOS transistor, and to a semiconductor device.

2. Description of the Related Art

In a circuit including a MOS transistor, in general, circuit constants are determined to design electrical characteristics of the circuit after modeling the MOS transistor as an ideal element without leakage current. However, in an actual MOS transistor, there are parasitic diodes between a source and the bulk and between a drain and the bulk. A reverse leakage current of the parasitic diode, which increases especially at high temperature, deteriorates electrical circuit characteristics. Further, a leakage current from a gate of the MOS transistor also deteriorates electrical circuit characteristics.

FIG. 4 is a circuit diagram of a related-art leakage current compensation circuit.

The related-art leakage current compensation circuit is configured to compensate for a reverse leakage current IL of a parasitic diode 411 of a MOS transistor 401 which has a drain to which a circuit 20 is connected and a gate to which a circuit 30 is connected.

Since reverse bias voltage is applied between the drain and the source of the NMOS transistor 401, in the parasitic diode 411 of the MOS transistor 401, the reverse leakage current IL flows to the bulk of the MOS transistor 401. As a result, a current flowing to the circuit 20 increases by an amount of the reverse leakage current IL. The reverse leakage current IL is a current error with respect to the operating current of the circuit 20, and hence deteriorates circuit performance.

The leakage current compensation circuit includes a MOS transistor 402 configured to generate, as a compensation current, a reverse leakage current IC of a compensation diode 412, and a current mirror circuit which includes MOS transistors 403 and 404 configured to supply, to the MOS transistor 401, an output current with use of the compensation current IC as an input current. The MOS transistor 401 and the MOS transistor 402 are transistors of the same type and the same size due to a process structure, and a gate of the MOS transistor 402 is connected to a ground terminal VSS so that the MOS transistor 402 is set to be in an OFF state. Thus, the reverse leakage current IC of the compensation diode 412 and the reverse leakage current IL of the parasitic diode 411 become equal to each other in magnitude. Accordingly, the reverse leakage current IL generated in the MOS transistor 401 is compensated for by the leakage current compensation circuit (for example, see Japanese Patent Application Laid-open No. Hei 8-340246).

However, in the related-art leakage current compensation circuit, it is required that the compensation MOS transistor 402 have the same size as that of the MOS transistor 401 in order to generate a compensation current IC having the same magnitude as that of the reverse leakage current IL, which is generated in the MOS transistor 401 and is to be compensated for. Accordingly, an area of the layout pattern greatly increases.

Further, compensation of the leakage current is limited to a reverse leakage current of a diode, and a leakage current from a gate, which tends to increase accompanying with miniaturization in the manufacturing process, cannot be compensated for.

SUMMARY OF THE INVENTION

The present invention has an object to provide a leakage current compensation circuit in which a MOS transistor for compensation of a leakage current has a small area, and which is capable of compensating for a gate leakage current.

In order to solve the above-mentioned problems, according to one embodiment of the present invention, there is provided a leakage current compensation circuit comprising:

a compensation MOS transistor having a drain and a source connected to each other, and a bulk connected to a ground terminal, and configured to generate a compensation current equal in magnitude to a leakage current of a MOS transistor of a current output circuit; and a current mirror circuit having an input terminal connected to the drain and the source of the compensation MOS transistor, and having an output terminal connected to the MOS transistor of the current output circuit.

According to the leakage current compensation circuit of the present invention, in the compensation MOS transistor configured to generate a compensation current for compensation of a reverse leakage current of a diode, both of a parasitic diode between the source and the bulk and a parasitic diode between the drain and the bulk are utilized. As a result, the compensation MOS transistor having an area of a layout pattern that is half of that of a compensation MOS transistor of a related-art method can be achieved.

Further, it is possible to simultaneously generate, by the compensation MOS transistor, a compensation current for a reverse leakage current of the parasitic diode and a compensation current for a gate leakage current by further connecting a gate of the compensation MOS transistor to the drain and the source. As a result, highly accurate leakage current compensation can be achieved by simultaneously compensating for a reverse leakage current of a parasitic diode of a MOS transistor in which a leakage current is to be compensated for and a gate leakage current of the MOS transistor.

DETAILED DESCRIPTION OF THE EMBODIMENTS

Now, embodiments of the present invention are described with reference to the drawings.

A leakage current compensation circuit of the present invention is configured to supply a current from a current source 110 to a terminal 109 with high accuracy.

First Embodiment

Figure 1:
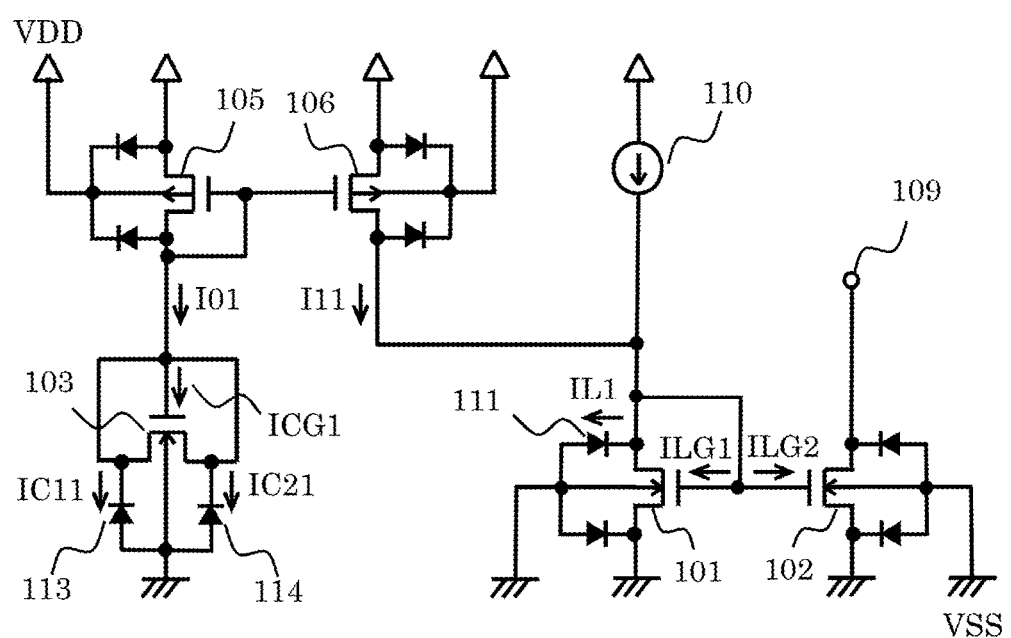
FIG. 1 is a circuit diagram of a leakage current compensation circuit of a first embodiment of the present invention.

FIG. 1 is a circuit diagram of a leakage current compensation circuit of a first embodiment of the present invention.

There is a parasitic diode 111 between a drain and a bulk of a MOS transistor 101. The parasitic diode 111 is in a reverse-bias state in which the parasitic diode 111 is applied with a drain-source voltage of the MOS transistor 101. Hence, a reverse leakage current IL1 of the parasitic diode 111 flows to the bulk connected to a ground terminal VSS. Further, a gate of the MOS transistor 101 and a gate of a MOS transistor 102 are connected to the drain of the MOS transistor 101. With this circuit configuration, a gate leakage current ILG1 flows to the MOS transistor 101 and a gate leakage current ILG2 flows to the MOS transistor 102. Accordingly, a current supplied from the current source 110 which is reduced by the sum of the leakage currents IL1, ILG1, and ILG2 flows to the terminal 109. The leakage current compensation circuit of the first embodiment has a function of compensating for the leakage currents IL1, ILG1, and ILG2.

The leakage current compensation circuit of the first embodiment includes a compensation MOS transistor 103 configured to generate compensation currents for the leakage currents, and a current mirror circuit for compensation which includes MOS transistors 105 and 106 configured to supply the compensation currents for the leakage currents to the MOS transistors 101 and 102 for which the leakage currents are compensated.

The compensation MOS transistor 103 has a gate, a source, and a drain that are connected to one another, and a bulk connected to the ground terminal VSS. The compensation MOS transistor 103 includes a parasitic diode 113 between the drain and the bulk and the parasitic diode 114 between the source and the bulk.

The compensation MOS transistor 103 is a transistor having the same structure as that of the MOS transistor 101 and the MOS transistor 102 for which the leakage currents are compensated, due to a manufacturing process. Further, in the structure of the MOS transistor 101 in which the leakage current is to be compensated for and the compensation MOS transistor 103, the source and the drain have the same diffusion shape. In addition, the parasitic diode 113 and the parasitic diode 114 have the same structure as that of the parasitic diode 111. Accordingly, in the case where a diffusion area of each of the parasitic diode 113 and the parasitic diode 114 of the MOS transistor 103 is set to one half of a diffusion area of the parasitic diode 111 of the MOS transistor 101, a relationship expressed by Equation (1) holds when a leakage compensation current flowing through the parasitic diode 113 is denoted by IC11, and a leakage compensation current flowing through the parasitic diode 114 is denoted by IC21.

$$IL1=IC11+IC21 \quad (1)$$

As described above, when the leakage compensation currents IC11 and IC21 whose sum is equal to the magnitude of the reverse leakage current IL1 of the parasitic diode 111 are generated by the compensation MOS transistor 103, both of the parasitic diode between the drain and the bulk and the parasitic diode between the source and the bulk are utilized in the method of the present invention. Consequently, the area of the layout pattern of the compensation MOS transistor 103 can be reduced to one half compared to a related-art method in which only a parasitic diode between a drain and a bulk of a compensation MOS transistor is used.

The compensation MOS transistor 103 generates a compensation current ICG1 from the gate leakage current in addition to the compensation currents IC11 and IC21 from the reverse leakage current by connecting the gate to the drain and the source.

Accordingly, when the ratio of the magnitude of an input current I01 to the magnitude of an output current I11 of the current mirror circuit for compensation which includes the MOS transistors 105 and 106 is set to one to one, a relationship expressed by Equation (2) holds for the reverse leakage current IL1 and the gate leakage current ILG1 of the parasitic diode 111 of the MOS transistor 101, the gate leakage current ILG2 of the MOS transistor 102, the compensation currents IC11 and IC21 of the reverse leakage current of the parasitic diodes 113, 114, and the compensation current ICG1 of the gate leakage current.

$$IC11+IC21+ICG1=I01=I11=IL1+ILG1+ILG2 \quad (2)$$

In short, the leakage current compensation circuit of the first embodiment achieves compensation for the reverse leakage current IL1 and for the gate leakage currents ILG1 and ILG2 simultaneously.

Second Embodiment

Figure 2:
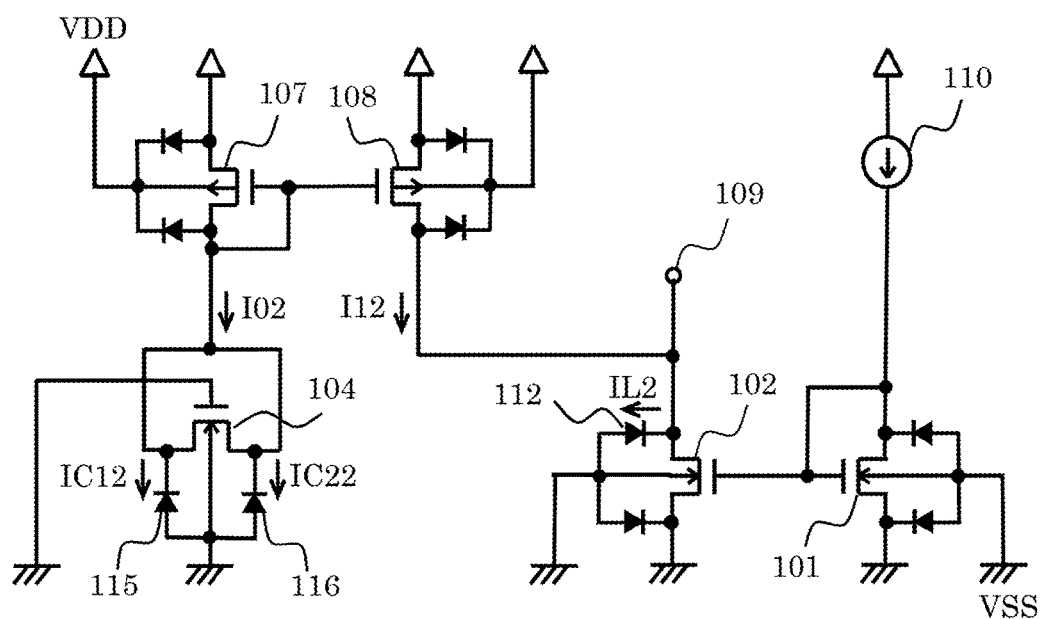
FIG. 2 is a circuit diagram of a leakage current compensation circuit of a second embodiment of the present invention.

FIG. 2 is a circuit diagram of a leakage current compensation circuit of a second embodiment of the present invention.

The leakage current compensation circuit of the second embodiment is configured to compensate only for a reverse leakage current IL2 of a parasitic diode 112 between the drain and the bulk of the MOS transistor 102.

The leakage current compensation circuit of the second embodiment includes a compensation MOS transistor 104 configured to generate a compensation current for the leakage current, and a current mirror circuit for compensation which includes MOS transistors 107 and 108 configured to supply the compensation current for the leakage current to the MOS transistor 102 for which the leakage current is compensated. The compensation MOS transistor 104 has a parasitic diode 115 between a drain and a bulk and a parasitic diode 116 between a source and the bulk.

The generation of the compensation current for the leakage current in this case corresponds to generation of only a compensation current for the reverse leakage current IL2 of the parasitic diode 112 which does not include a gate leakage current. Hence, a gate of the compensation MOS transistor 104 is connected to the ground terminal VSS.

A relationship expressed by Equation (3) holds when the reverse leakage current of the parasitic diode 115 is denoted by IC12, the reverse leakage current of the parasitic diode 116 is denoted by IC22, and the input current and the output current of the current mirror circuit which supplies the compensation current are denoted by I02 and I12, respectively.

$$IC12+IC22=I02=I12=IL2 \quad (3)$$

As described above, the leakage current compensation circuit of the second embodiment is capable of compensating for the reverse leakage current IL2 of the parasitic diode 112 which is generated in the MOS transistor 102.

Also in the leakage current compensation circuit of the second embodiment, the compensation MOS transistor 104 utilizes both of the parasitic diode 115 between the drain and the bulk and the parasitic diode 116 between the source and the bulk to generate compensation current. Consequently, the area of the layout pattern of the compensation MOS transistor 104 can be reduced to one half compared to the related-art method.

Third Embodiment

Figure 3:
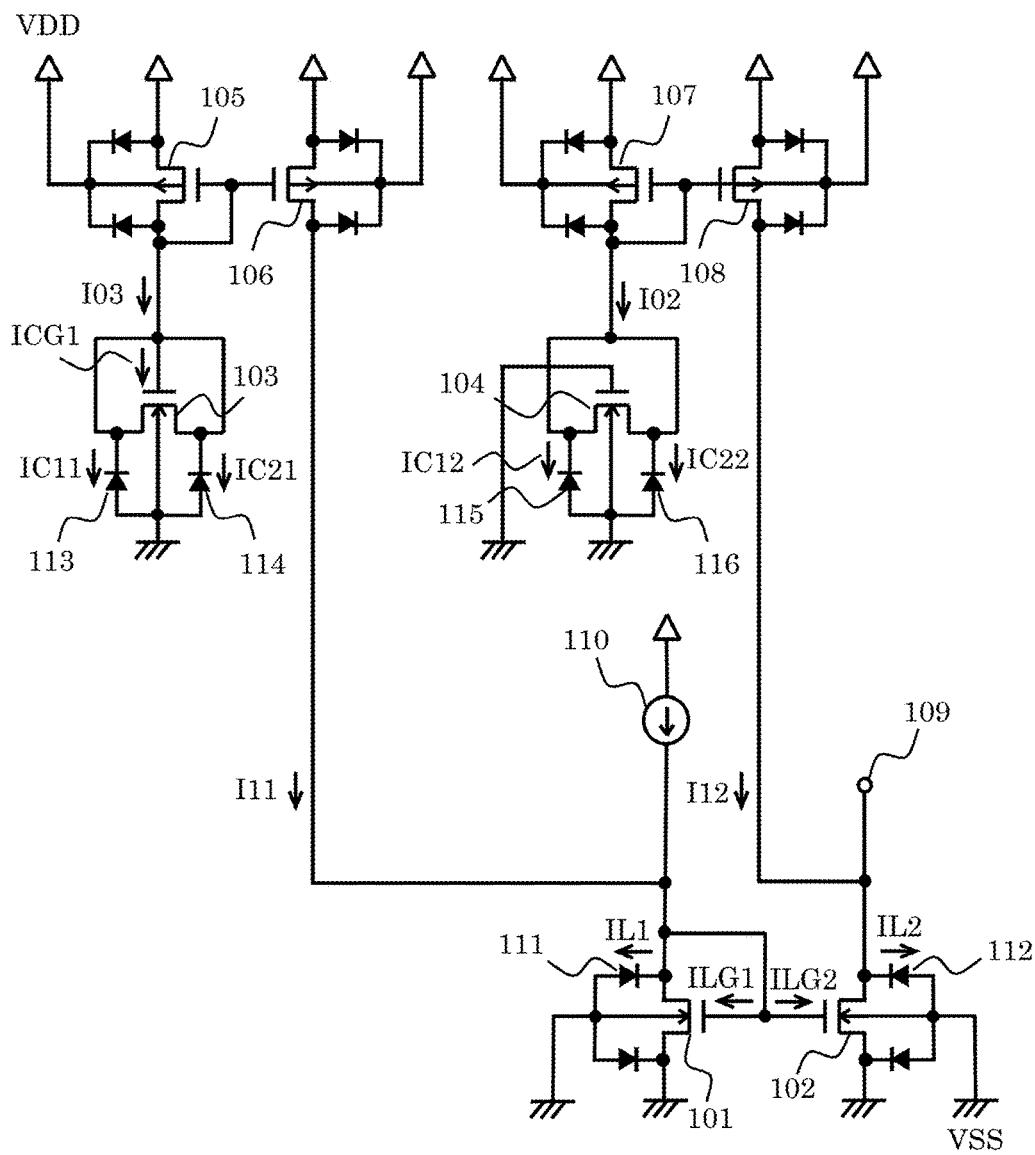
FIG. 3 is a circuit diagram of a leakage current compensation circuit of a third embodiment of the present invention.
Figure 4:
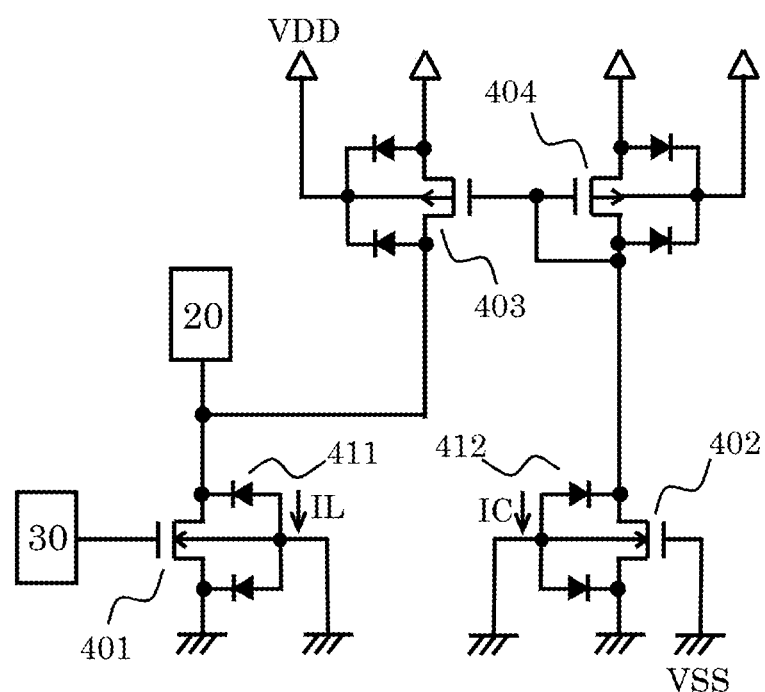
FIG. 4 is a circuit diagram of a related-art leakage current compensation circuit.

FIG. 3 is a circuit diagram of a leakage current compensation circuit of a third embodiment of the present invention.

The leakage current compensation circuit of the third embodiment is applied by combining the leakage current compensation circuits of the first embodiment and the second embodiment.

The leakage current compensation circuit of the third embodiment includes a first leakage current compensation circuit configured to compensate for a reverse leakage current of the parasitic diode 111 of the MOS transistor 101 and gate leakage currents of the MOS transistor 101 and the MOS transistor 102 and a second leakage current compensation circuit configured to compensate for a reverse leakage current of the parasitic diode 112 of the MOS transistor 102.

The first leakage current compensation circuit and the second leakage current compensation circuit have the same configurations as those of the leakage current compensation circuit of the first embodiment and the leakage current compensation circuit of the second embodiment. Hence, detailed description thereof is omitted.

The leakage current compensation circuit of the third embodiment compensates for the leakage currents of the MOS transistor 101 and the MOS transistor 102 with use of the first leakage current compensation circuit and the second leakage current compensation circuit. As a result, it is possible to supply a current from the current source 110 to the terminal 109 with higher accuracy.

As described above, the leakage current compensation circuit of the present invention includes the MOS transistor for compensation of the leakage current, which has a small area, and is capable of compensating for the gate leakage current.

The embodiments of the present invention have been described above, but the present invention is not limited to the above-mentioned embodiments, and it is to be understood that various modifications can be made thereto without departing from the gist of the present invention.

For example, in the above description, the transistor in which the leakage current is to be compensated for is an N-channel MOS transistor. However, the leakage current compensation circuit of the present invention is applicable also when the leakage current compensation circuit includes a P-channel MOS transistor, and the same effect can be obtained.

What is claimed is:

1. A leakage current compensation circuit configured to compensate for a leakage current of a MOS transistor constructing an output circuit configured to output a current from a current source to an output terminal,
the leakage current compensation circuit comprising:
a compensation MOS transistor having a drain and a source connected to each other, and a bulk connected to a ground terminal, and configured to generate a compensation current equal in magnitude to the leakage current; and
a current mirror circuit having an input terminal connected to the drain and the source of the compensation MOS transistor, and having an output terminal connected to the MOS transistor constructing the output circuit.

2. A leakage current compensation circuit according to claim 1, wherein the compensation MOS transistor comprises a gate connected to the ground terminal, and is configured to generate, with use of a leakage current of a parasitic diode between the drain and the bulk and a leakage current of a parasitic diode between the source and the bulk, a compensation current that is equal in magnitude to a reverse leakage current of a parasitic diode between a drain and a bulk of the MOS transistor constructing the output circuit.

3. A leakage current compensation circuit according to claim 1, wherein the compensation MOS transistor comprises a gate connected to the drain and the source, and is configured to generate, with use of a leakage current from the gate, a compensation current that is equal in magnitude to a gate leakage current of the MOS transistor constructing the output circuit.

4. A semiconductor device, comprising the leakage current compensation circuit of claim 1.

5. A semiconductor device, comprising the leakage current compensation circuit of claim 2.

6. A semiconductor device, comprising the leakage current compensation circuit of claim 3.

* * * * *